(12) United States Patent
Pandey et al.

(10) Patent No.: US 12,139,790 B2
(45) Date of Patent: *Nov. 12, 2024

(54) PROCESSING SYSTEM AND METHOD OF DELIVERING A REACTANT GAS

(71) Applicant: Applied Materials, Inc., Santa Clara, CA (US)

(72) Inventors: Vishwas Kumar Pandey, Madhya Pradesh (IN); Christopher Olsen, Fremont, CA (US); Rene George, San Carlos, CA (US); Eric Shono, San Mateo, CA (US); Lara Hawrylchak, Gilroy, CA (US); Erika Hansen, San Jose, CA (US); Tobin Kaufman-Osborn, Sunnyvale, CA (US); Hansel Lo, San Jose, CA (US); Kartik Shah, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 135 days.

This patent is subject to a terminal disclaimer.

(21) Appl. No.: 17/753,524

(22) PCT Filed: Sep. 9, 2020

(86) PCT No.: PCT/US2020/049853
§ 371 (c)(1),
(2) Date: Mar. 7, 2022

(87) PCT Pub. No.: WO2021/050489
PCT Pub. Date: Mar. 18, 2021

(65) Prior Publication Data
US 2022/0411927 A1    Dec. 29, 2022

Related U.S. Application Data

(63) Continuation of application No. 16/776,204, filed on Jan. 29, 2020, now Pat. No. 11,486,038.
(Continued)

(51) Int. Cl.
*C23C 16/40* (2006.01)
*C23C 16/455* (2006.01)
(Continued)

(52) U.S. Cl.
CPC ........ *C23C 16/45517* (2013.01); *C23C 16/40* (2013.01); *C23C 16/45563* (2013.01);
(Continued)

(58) Field of Classification Search
CPC .............. C23C 16/45517; C23C 16/40; C23C 16/45563; C23C 16/45582;
(Continued)

(56) References Cited

U.S. PATENT DOCUMENTS 5,091,219 A * 2/1992 Monkowski ...... C23C 16/45504
427/314
5,304,248 A    4/1994 Cheng et al.
(Continued)

FOREIGN PATENT DOCUMENTS

CN    107403714 A    11/2017
CN    107690487 A    2/2018
(Continued)

OTHER PUBLICATIONS

TW Office Action dated Aug. 21, 2023 for Application No. 109102773.
(Continued)

*Primary Examiner* — Rudy Zervigon
(74) *Attorney, Agent, or Firm* — Patterson + Sheridan, LLP

(57) ABSTRACT

Embodiments described herein generally relate to a processing system and a method of delivering a reactant gas. The
(Continued)

processing system includes a substrate support system, an injection cone, and an intake. The injection cone includes a linear rudder. The linear rudder is disposed such that the flow of reactant gas through the injection cone results in film growth on a specific portion of a substrate. The method includes flowing the gas through the injection cone and delivering the gas onto the substrate below. The localization of the reactant gas, allows for film growth on a specific portion of the substrate.

17 Claims, 7 Drawing Sheets

Related U.S. Application Data

(60) Provisional application No. 62/897,900, filed on Sep. 9, 2019.

(51) Int. Cl.
  *C23C 16/458* (2006.01)
  *C23C 16/52* (2006.01)
  *H01L 21/67* (2006.01)

(52) U.S. Cl.
  CPC .. *C23C 16/45582* (2013.01); *C23C 16/45587* (2013.01); *C23C 16/45591* (2013.01); *C23C 16/4584* (2013.01); *C23C 16/52* (2013.01); *H01L 21/67017* (2013.01)

(58) Field of Classification Search
  CPC ........ C23C 16/45587; C23C 16/45591; C23C 16/4584; C23C 16/52; C23C 16/45502; C23C 16/04; C23C 16/45589; H01L 21/67017
  USPC ....................... 118/715; 156/345.31, 345.32; 427/248.1; 216/58
  See application file for complete search history.

(56) References Cited

U.S. PATENT DOCUMENTS

| | | | |
|---|---|---|---|
| 5,518,593 | A | 5/1996 | Hosokawa et al. |
| 6,099,648 | A | 8/2000 | Anderson |
| 6,111,225 | A | 8/2000 | Ohkase et al. |
| 6,291,800 | B1 | 9/2001 | Shirakawa et al. |
| 10,982,325 | B2 * | 4/2021 | Kostamo ........... C23C 16/45587 |
| 11,486,038 | B2 | 11/2022 | Shono et al. |
| 2002/0185062 | A1 | 12/2002 | Halpin |
| 2003/0150560 | A1 | 8/2003 | Kinnard et al. |
| 2003/0178145 | A1 | 9/2003 | Anderson et al. |
| 2004/0241992 | A1 | 12/2004 | Kono et al. |
| 2006/0249695 | A1 | 11/2006 | Choi |
| 2007/0107653 | A1 | 5/2007 | Yamada |
| 2007/0281084 | A1 | 12/2007 | Hirosawa et al. |
| 2008/0178801 | A1 | 7/2008 | Pavloff et al. |
| 2009/0214798 | A1 | 8/2009 | Yousif et al. |
| 2011/0174212 | A1 | 7/2011 | Ramachandran et al. |
| 2012/0085278 | A1 | 4/2012 | Moslehi et al. |
| 2012/0266819 | A1 | 10/2012 | Sanchez et al. |
| 2014/0190822 | A1 | 7/2014 | Riker et al. |
| 2014/0273503 | A1 * | 9/2014 | Pitney ............... C23C 16/45563 438/758 |
| 2014/0322897 | A1 | 10/2014 | Samir et al. |
| 2016/0189951 | A1 | 6/2016 | Lee et al. |
| 2016/0217979 | A1 * | 7/2016 | Kim .................... H01J 37/3244 |
| 2017/0314126 | A1 | 11/2017 | Tjandra et al. |
| 2018/0223426 | A1 | 8/2018 | Shono |
| 2019/0048463 | A1 | 2/2019 | Toramaru et al. |
| 2020/0240014 | A1 * | 7/2020 | Shono ............... H01L 21/67017 |
| 2022/0364231 | A1 * | 11/2022 | Ishikawa ................. C23C 16/46 |

FOREIGN PATENT DOCUMENTS

| | | |
|---|---|---|
| JP | S61-253822 A | 11/1986 |
| JP | 08335558 A | 12/1996 |
| JP | H11-176811 A | 7/1999 |
| JP | 2000-331939 A | 11/2000 |
| JP | 2001118799 A | 4/2001 |
| JP | 2002198316 A | 7/2002 |
| JP | 2003-197719 A | 7/2003 |
| JP | 2003197532 A | 7/2003 |
| JP | 2004-134625 A | 4/2004 |
| JP | 3516654 B2 | 4/2004 |
| JP | 2004-200603 | 7/2004 |
| JP | 2005072118 A | 3/2005 |
| JP | 2005-517295 A | 6/2005 |
| JP | 2005-183510 A | 7/2005 |
| JP | 2005-197380 A | 7/2005 |
| JP | 2005-259902 A | 9/2005 |
| JP | 2005260095 A | 9/2005 |
| JP | 2006-049503 A | 2/2006 |
| JP | 2007-294492 A | 11/2007 |
| JP | 2007324285 A | 12/2007 |
| JP | 2008-235830 A | 10/2008 |
| JP | 4320574 B2 | 8/2009 |
| JP | 2009239082 A | 10/2009 |
| JP | 2010147350 A | 7/2010 |
| JP | 2012-54310 A | 3/2012 |
| JP | 2012-054567 A | 3/2012 |
| JP | 2012222301 A | 11/2012 |
| JP | 2016035087 A | 3/2016 |
| JP | 2018-157196 A | 10/2018 |
| JP | 2021543200 A1 | 7/2020 |
| KR | 1020100048480 A | 5/2010 |
| KR | 100980642 B1 | 9/2010 |
| KR | 10-2017-0006175 A | 1/2017 |
| KR | 10-2017-0123256 A | 11/2017 |
| KR | 10-2018-0091760 A | 8/2018 |
| TW | 200808985 A | 2/2008 |
| TW | 200809926 A | 2/2008 |
| TW | 201305373 A | 2/2013 |
| TW | I457997 B | 10/2014 |
| TW | I591199 B | 7/2017 |
| TW | M569933 U | 11/2018 |
| WO | 2013016266 A1 | 1/2013 |

OTHER PUBLICATIONS

Search Report for Chinese Application No. 202080062904.0 dated Nov. 28, 23.
Office Action for Chinese Application No. 202080062904.0 dated Nov. 29, 23.
Japanese Office Action for Application No. 2022-514991 dated Apr. 18, 2023.
International Search Report and Written Opinion dated Jul. 25, 2014 for PCT/US2014/026589.
International Search Report and Written Opinion dated Jul. 22, 2014 for PCT/US2014/026616.
Office Action from Japanese Patent Application Serial No. 2013-240740 dated Jan. 13, 2017.
Office Action from Chinese Patent Application No. 201480013791 dated Apr. 13, 2017.
International Search Report dated May 27, 2020 for Application No. PCT/US2020/015801.
Chinese Office Action Dated May 10, 2024 re: Chinese Application No. 202080062904.0 1.
TW Office Action dated Apr. 10, 2024 TW Patent Appl. No. 109130930.
Notice of Preliminary Rejection dated Jun. 10, 2024 re: Korean Application No. 10-2022-7011795.
Singapore Search Report dated Sep. 12, 2024 re: Singapore Application No. 11202201310T.

* cited by examiner

PROCESSING SYSTEM AND METHOD OF DELIVERING A REACTANT GAS

BACKGROUND

Field

Embodiments of the present disclosure relate to an apparatus and a method and, more specifically, to a processing system and a method of delivering a reactant gas.

Description of the Related Art

In fabrication of memory gate oxides, liner oxides, sacrificial oxides, sidewall oxides, flash tunnel oxides, oxide-nitride-oxide (ONO) stacks, or the like in integrated circuits and micro-devices, semiconductor substrates may be processed by rapid thermal oxidation. In this process, an oxide layer may be formed on a substrate by exposing the substrate to oxygen and hydrogen based reactant gas while heating the substrate with a radiant heat source to produce oxygen and hydrogen radicals. Oxygen radicals strike the surface of the substrate to form an oxide layer, for example, a silicon dioxide layer on a silicon substrate.

Conventionally, a rotatable substrate support rotates a substrate while a reactant gas is introduced straight towards the center of the substrate. The injection system injects reactant gas into the chamber and onto the substrate, where the reactant gas reacts with the substrate to form the desired layer. Conventional injection cones result in a wide spread of reactant gas attempting to cover the entire substrate surface.

One drawback to injection systems in the art is that injection systems do not evenly distribute reactant gas on the surface of the substrate. The reactant gas is distributed more at the center of the substrate and less near edges of the substrate, and thus thickness of an oxide layer grown near the edges of the substrate is less than at or near the center of the substrate. For example, the center-to-edge (CE) thickness difference is unacceptably high.

Therefore, there is a need for an improved processing system and method that distributes reactant gas more uniformly over the substrate.

SUMMARY

In one embodiment, an injection cone is provided, including a body. The body includes a first portion configured to deliver a reactant gas, and a second portion configured to accept the reactant gas. The first portion includes a bottom surface and one rudder. The first portion and the second portion are separated by a dividing line.

In another embodiment, a processing system is provided, including an injection cone, an intake, and a substrate support system. The injection cone includes a body. The body includes a first portion configured to deliver a reactant gas, and a second portion configured to accept the reactant gas. The first portion includes a bottom surface and one linear rudder. The first portion and the second portion are separated by a dividing line. The intake is coupled to the injection cone. The intake is configured to deliver the reactant gas. The substrate support system includes a substrate support.

In yet another embodiment, a method of delivering a reactant gas is provided, including flowing the reactant gas through an intake, flowing the reactant gas through an injection cone, and delivering the reactant gas to a surface of a substrate disposed over a substrate support such that a film is formed on the surface of the substrate. The injection cone includes a body. The body includes a first portion configured to deliver a reactant gas, and a second portion configured to accept the reactant gas. The first portion includes a bottom surface and a linear rudder. The first portion and the second portion are separated by a dividing line. The intake is coupled to the injection cone. The intake is configured to deliver the reactant gas. The substrate support system includes a substrate support.

The processing system provides a localized growth of the film on a portion of the substrate. The method allows for piecewise or continuous growth of the film on the substrate, and the uniformity of the film is thus improved.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to a processing system and a method of delivering a reactant gas. The processing system includes a substrate support system, an injection cone, and an intake. The injection cone includes a linear rudder. The linear rudder is disposed such that the flow of reactant gas through the injection cone results in film deposition on a specific portion of a substrate. The method includes flowing the gas through the injection cone and delivering the gas onto the substrate below. The localization of the reactant gas allows for film growth on a specific portion of the substrate. The substrate can be rotated, and the process repeated, resulting in piecewise growth of a film layer with improved uniformity. Embodiments of the disclosure may be useful for, but are not restricted to, a processing system and a method for piecewise growth of a film.

As used herein, the term "about" refers to a +/−10% variation from the nominal value. It is to be understood that such a variation can be included in any value provided herein.

Figure 1A:
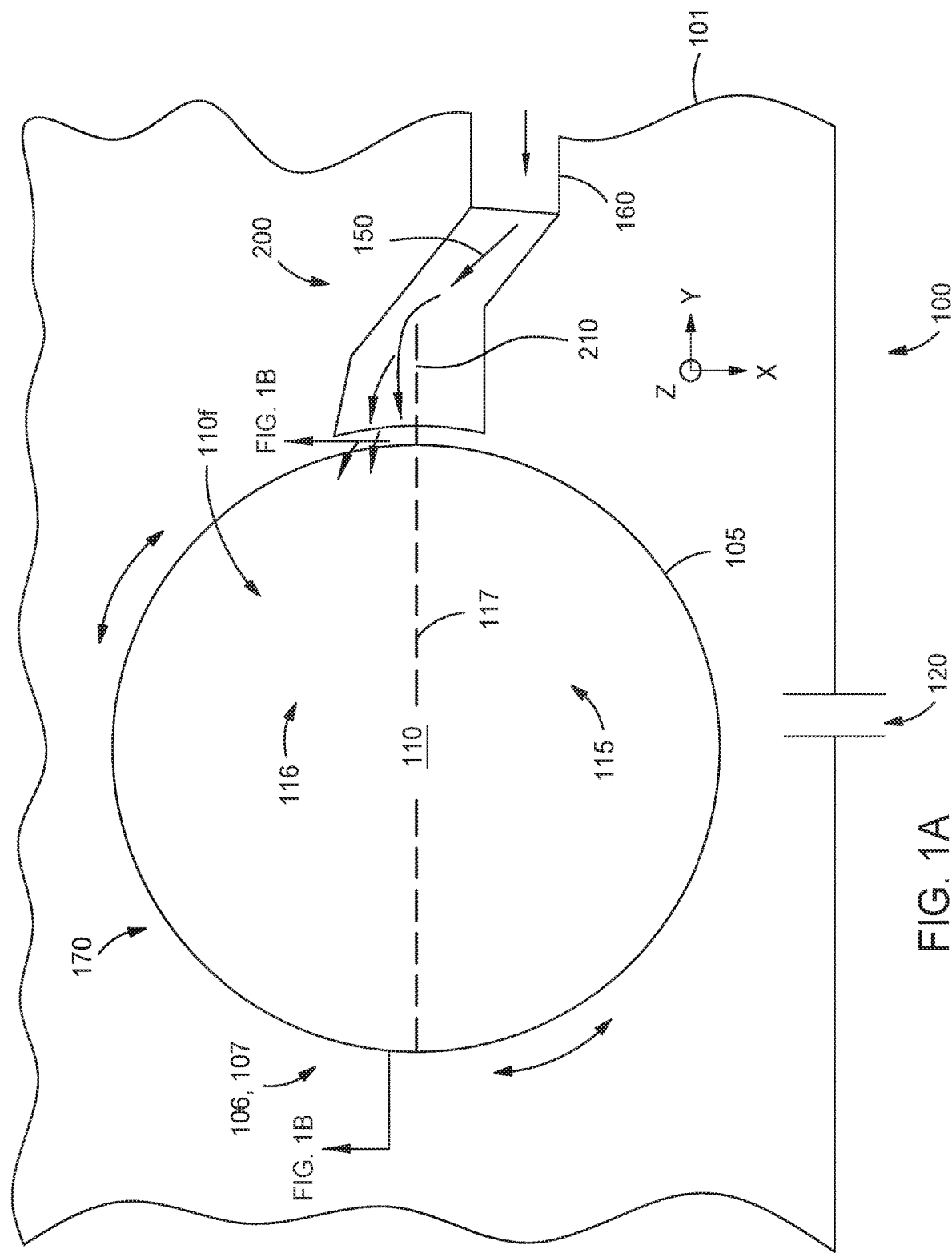
FIGS. 1A-1B illustrate schematic views of a processing system, according to one embodiment.
Figure 1B:
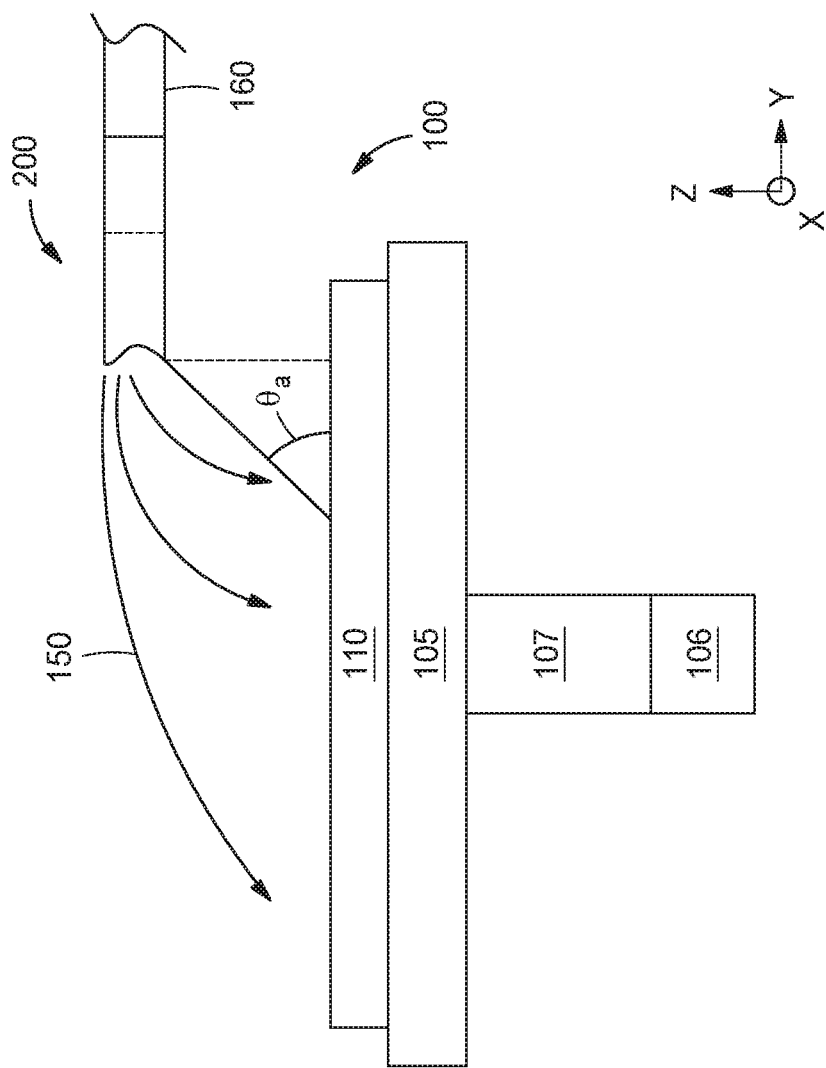

FIG. 1A illustrates a schematic top view of a processing system 100, and FIG. 1B illustrates a schematic side view of the processing system, according to one embodiment. As shown, the processing system 100 includes a substrate support system 170, an injection cone 200, and an intake 160. The processing system 100 is disposed in a processing chamber 101, and the processing chamber 101 can be any chamber in the art used for growing a film on a substrate, such as a thermal growth chamber. The processing chamber 101 includes an exhaust 120, and unwanted byproducts from film growth are evacuated through the exhaust. The processing system 100 is configured to deposit a reactive gas on a substrate disposed on the substrate support system 170, such that a desired film is grown on the substrate.

As shown, the substrate support system 170 includes an actuator 106, a shaft 107, and a substrate support 105. The substrate support 105 is supported by the shaft 107, and the shaft is coupled to the actuator 106. The actuator 106 is configured to rotate the substrate support 105 around a z-axis. The actuator 106 can rotate the substrate support 105 in a continuous or step-wise fashion. The actuator 106 can rotate the substrate support 105 clockwise or counterclockwise. The actuator 106 can rotate the substrate 110 during film growth, or the substrate support 105 can remain stationary during film growth. The actuator 106 is controlled by a controller (not shown), and the controller gives commands to the actuator. A substrate 110 is supported on the substrate support 105. The substrate support 105 can also include a cooling system (not shown), a heater (not shown), an electrostatic chuck (ESC) (not shown), or a magnetic levitation system, depending on whether the film deposition process includes increasing or decreasing the substrate temperature or electrically biasing the substrate. The substrate support system 170 is configured to rotate the substrate 110 before, during, or after film growth on the substrate.

The substrate 110 includes any suitable material, including, but not limited to, amorphous dielectrics, non-amorphous dielectrics, crystalline dielectrics, silicon oxide, polymers, and combinations thereof. Suitable examples include oxides, sulfides, phosphides, tellurides, or combinations thereof. In one example, the substrate 110 includes silicon (Si), silicon dioxide ($SiO_2$), germanium (Ge), silicon germanium (SiGe), or sapphire. The substrate can include any other additional layers disposed thereon.

The reaction gas (flow shown by arrow 150) can be any processing gas in the art used to grow a film, such as, but not limited to, oxygen gas ($O_2$), hydrogen gas ($H_2$), nitrous oxide ($N_2O$), carbon dioxide ($CO_2$), hydrogen peroxide ($H_2O_2$), ozone ($O_3$), water ($H_2O$), ammonia ($NH_3$), nitrogen gas ($N_2$), helium (He), argon (Ar), any other neutral carrier gas, any combination of the above, any plasma created from the above, and any ion or radical created from the above. In one example, the substrate 110 includes Si, the reaction gas includes $O_2$ and $N_2$, and the deposited film 110f includes $SiO_2$. In addition, although the term "growth" and "grown" is used throughout the present disclosure, it is to be understood that any form of creating a film is covered by the disclosure, including film growth or film deposition.

The substrate support 105 is divided into a higher growth portion 116 and a lower growth portion 115 by a separation line 117. The processing system 100 is configured such that most or all of the growth of a film 110f occurs on the portion of the substrate 110 disposed over the higher growth portion 116 of the substrate support 105. Likewise, little or none of the growth of the film 110f occurs on the portion of the substrate 110 disposed over the lower growth portion 115 of the substrate support 105. Thus, the film growth can be largely restricted to a certain portion of the substrate 110. The lower growth portion 115 and the growth portion 116 have about the same area, according to one embodiment.

Figure 1C:
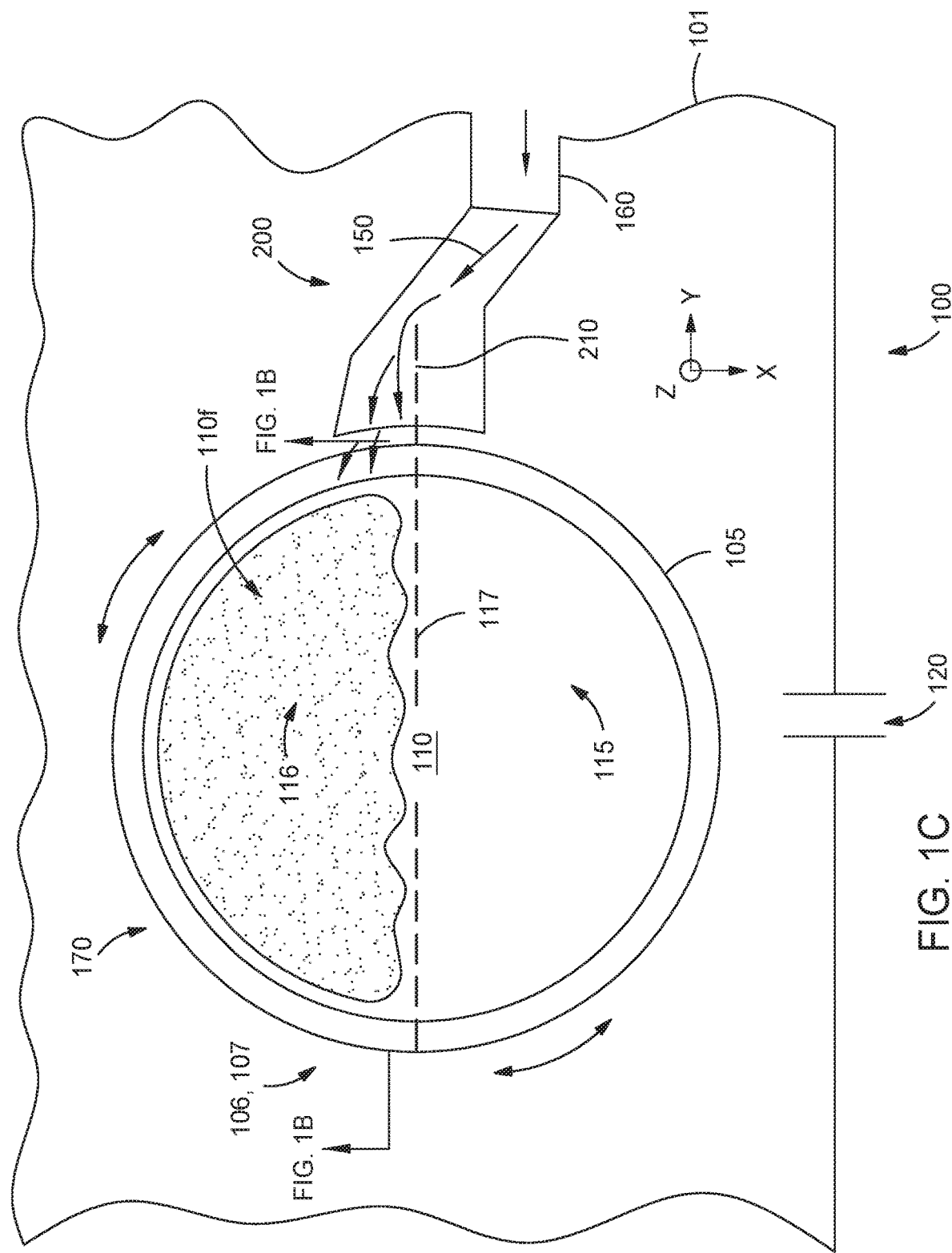
FIG. 1C illustrates a schematic top view of a processing system after a film is deposited, according to one embodiment.

FIG. 1C illustrates a schematic top view of the processing system 100 after a film 110f is deposited, according to one embodiment. As shown, the film 110f is grown mostly or only on the portion of the substrate disposed over the higher growth portion 116 of the substrate support 105.

Figure 1D:
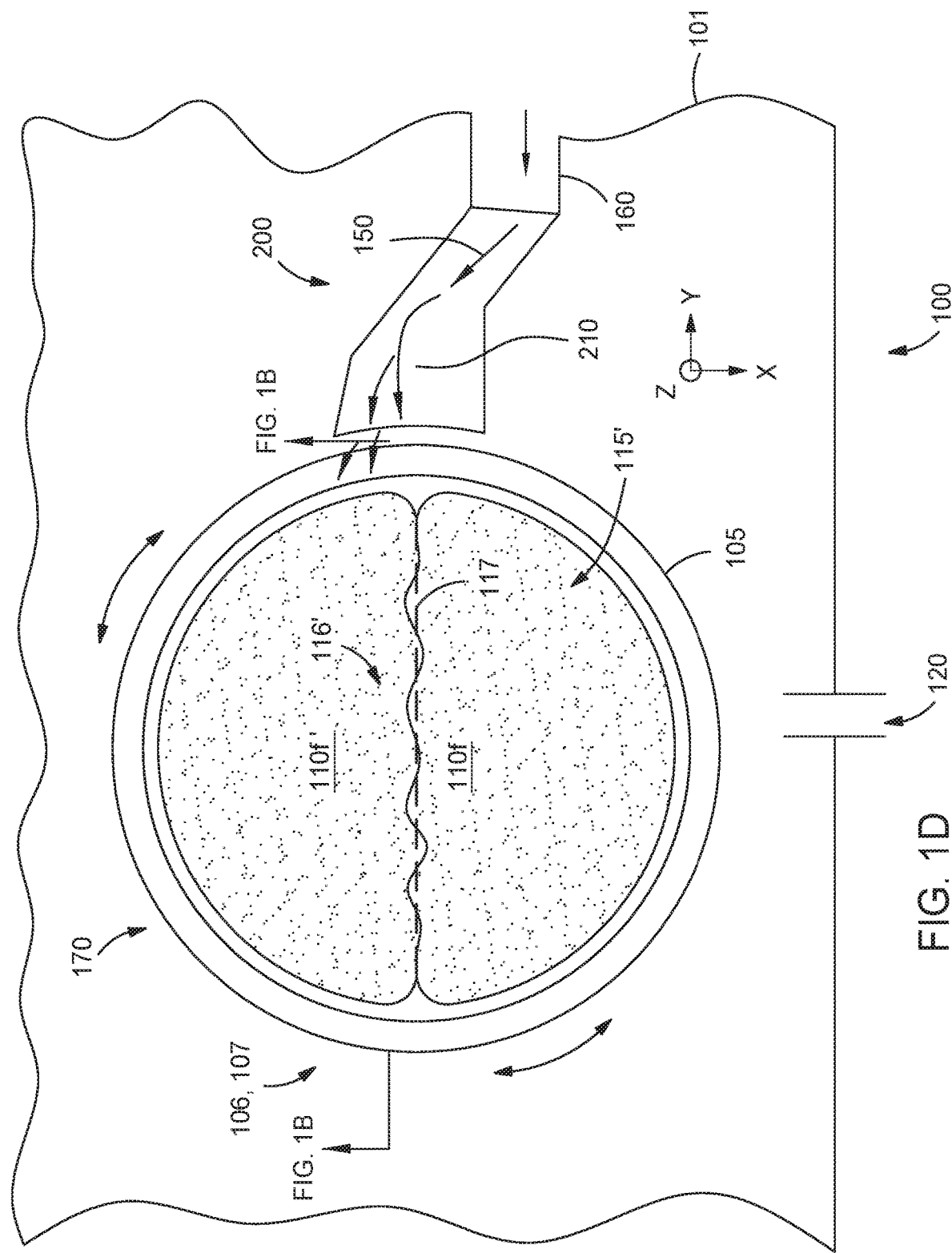
FIG. 1D illustrates a schematic top view of a processing system after a film is deposited a second time, according to one embodiment.

FIG. 1D illustrates a schematic top view of a processing system 100 after a film 110f' is grown a second time, according to one embodiment. After the film 110f is grown, the substrate support 105 is rotated about 180°, such that the film 110f is disposed over the portion of the substrate 110 disposed over the new lower growth portion 115' of the substrate support 105, and the portion of the substrate without the film growth is disposed over the higher growth portion 116 of the substrate support 105. The growth can be repeated, such that the film 110f' is grown on the substrate 110 disposed over the new higher growth portion 116' of the substrate support 105, which results in an even film growth of the film 110f, 110f' over the entire substrate. In other embodiments, the second delivery of the reaction gas can include a different gas, and thus the films 110f, 110f' can include different materials.

The injection cone 200 can be disposed in a window (not shown) in a wall (not shown) of the processing chamber 101. The injection cone 200 is disposed such that it makes an angle $\theta_a$ with the surface of the substrate support 105 (FIG. 1B). The angle $\theta_a$ is from about 20° to about 30°, according to one embodiment.

Figure 2A:
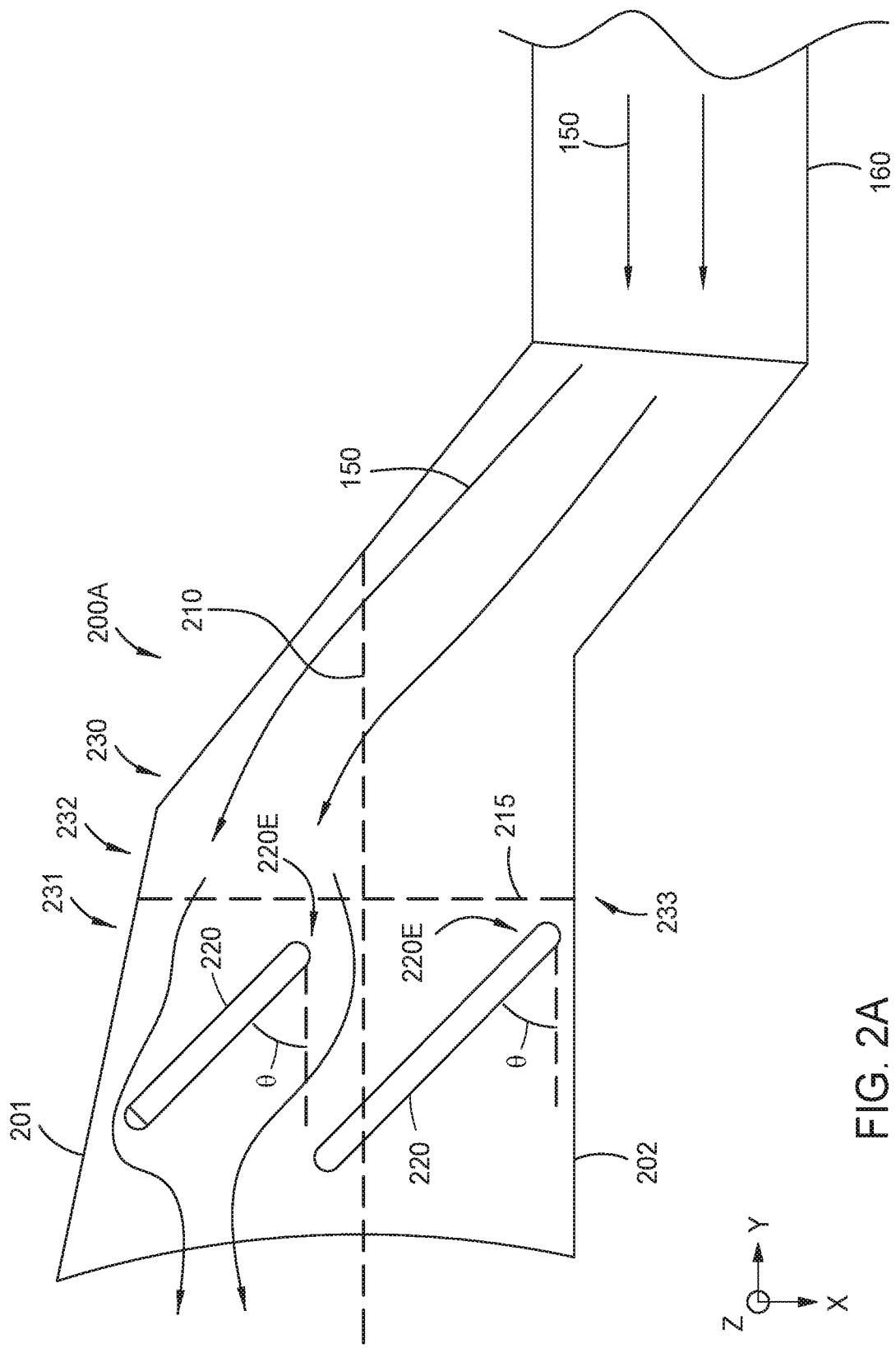
FIG. 2A illustrates a schematic view of an injection cone with two linear rudders, according to one embodiment.
Figure 2B:
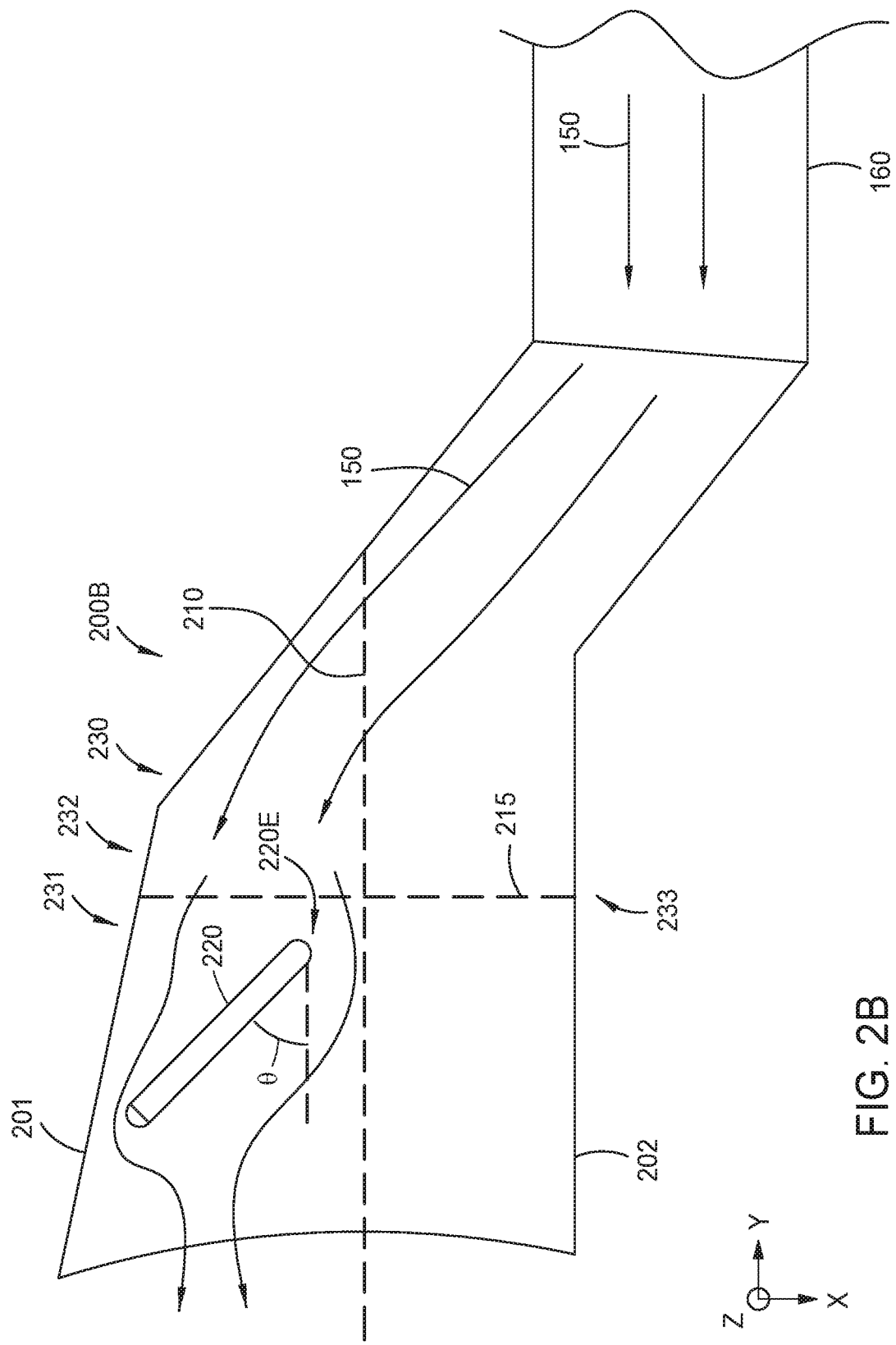
FIG. 2B illustrates a schematic view of an injection cone with a single linear rudder, according to one embodiment.

FIGS. 2A and 2B illustrate schematic views of the injection cone 200 with two linear rudders and a one linear rudder, according to one embodiment. As shown in FIG. 2A, the injection cone 200A includes a body 201, a bottom surface 202, and two linear rudders 220. As shown in FIG. 2B, the injection cone 200B includes a body 201, a bottom surface 202, and a linear rudder 220. Although only two linear rudders 220 are shown in the embodiment illustrated in FIG. 2A and one linear rudder 220 is shown in the embodiment illustrated in FIG. 2B, it is to be understood that any number of linear rudders 220 can be included in the injection cone 200. The body 201 and the linear rudder(s) 220 can be made of quartz or any other material unreactive to the reactant gas. The injection cone 200 is divided into a first portion 231 and a second portion 230 by a dividing line 215, wherein the dividing line is parallel to the x-direction. The linear rudders 220 are disposed in the first portion 231. The first portion 231 and second portion 230 can be two separate pieces that combine to make the injection cone 200, or the first portion and the second portion can be made of the same piece. The injection cone 200 is coupled to the intake 160, and the intake delivers the reaction gas to the injection cone. The injection cone 200 is configured to deliver the reaction gas to the substrate 110. Although the injection cone 200 is depicted opening toward the substrate support system 170 from one direction in FIG. 1D, it is also contemplated that the injection cone 200 can open toward the substrate support system 170 from other directions. In particular, the injection cone 200 depicted in FIGS. 2A and 2B can be flipped about the X-axis, and/or rotated at any position about the substrate support system 170.

The injection cone 200 is divided into a top portion 232 and a bottom portion 233 by a separation line 210, wherein the separation line 210 is parallel to the y-direction. The linear rudders 220 (e.g., FIG. 2A) or linear rudder 220 (e.g., FIG. 2B) are each disposed and angled in such a way that the reaction gas flows mostly or completely through the top portion 232 of the injection cone 200, according to one embodiment. In some embodiments, which can be combined with other embodiments described herein, as shown in FIG. 2B, the rudder is disposed in the top portion 232. The separation line 210 of the injection cone 200 is parallel with the separation line 117 of the substrate support 105, according to one embodiment. If the reactant gas is allowed to flow through the bottom portion 233 of the injection cone 200, a large portion of the reaction gas misses the majority of the substrate area and remains unreacted or drawn into the exhaust 120, wasting the reactant gas and resulting in uneven film growth on the portion of the substrate disposed over the lower growth portion 115. In addition, injection cones without rudders exhibit jet stream-like flow, where the flow is concentrated in one narrow stream. The injection cone 200 disclosed herein allows for flow 150 spread in a much wider area, while still being focused on the higher growth portion 116.

The flow 150 through the top portion 232 of the injection cone 200 allows for a growth of film 110f mostly or entirely on the portion of the substrate 110 disposed over the higher growth portion 116 of the substrate support 105. In addition, the increased circulation of the reactant gas due to the linear rudders 220 increases the reaction rate of the reaction gas with the substrate 110, leading to faster film 110f growth. The linear rudders 220 are disposed such that the integrated velocity (with respect to the area of the higher growth portion 116) of the reactant gas over the higher growth portion 116 is as high as possible, while the integrated velocity still being as uniform as possible in the higher growth portion 116. The linear rudders 220 allow for a higher velocity of flow 150 than other rudder shapes, such as wedges.

The linear rudders 220 can be disposed in any arrangement within the first portion 231 of the injection cone 200. The linear rudders 220 have an angle θ with respect to the bottom surface 202. Each of the linear rudders 220 can have the same angle θ or a different angle, according to some embodiments. The angle θ varies from about 5° to about 85°, such as from about 10° to about 40°, such as from about 25° to about 55°, or from about 35° to about 45°, according to some embodiments. In some embodiments there is a single linear rudder having an end 220E that is separated from the bottom surface 202 by a distance of about 15 mm to about 60 mm, according to one embodiment. An end 220E of the linear rudder 220 is separated from the dividing line 215 by a distance of about 35 mm to about 45 mm, according to one embodiment. In some embodiments, which can be combined with other embodiments described herein, as shown in FIG. 2B, an end 220E of the rudder 220 is separated from the bottom surface 202 by a distance of about 12 mm to about 50 mm, such as about 12 mm to about 40 mm, such as about 25 mm to about 40 mm. A total max distance between the top surface 201 and bottom surface 202 is less than 80 mm, such as about 60 mm to about 75 mm. The linear rudders in the plurality of linear rudders 220 have a length from about 25 mm to about 75 mm, according to one embodiment. The plurality of linear rudders 220 are disposed such that a flow 150 of the reactant gas out of the injection cone 200 has a Reynolds number (Re) of about 100 or less, and the flow is laminar, according to one embodiment.

Figure 3:
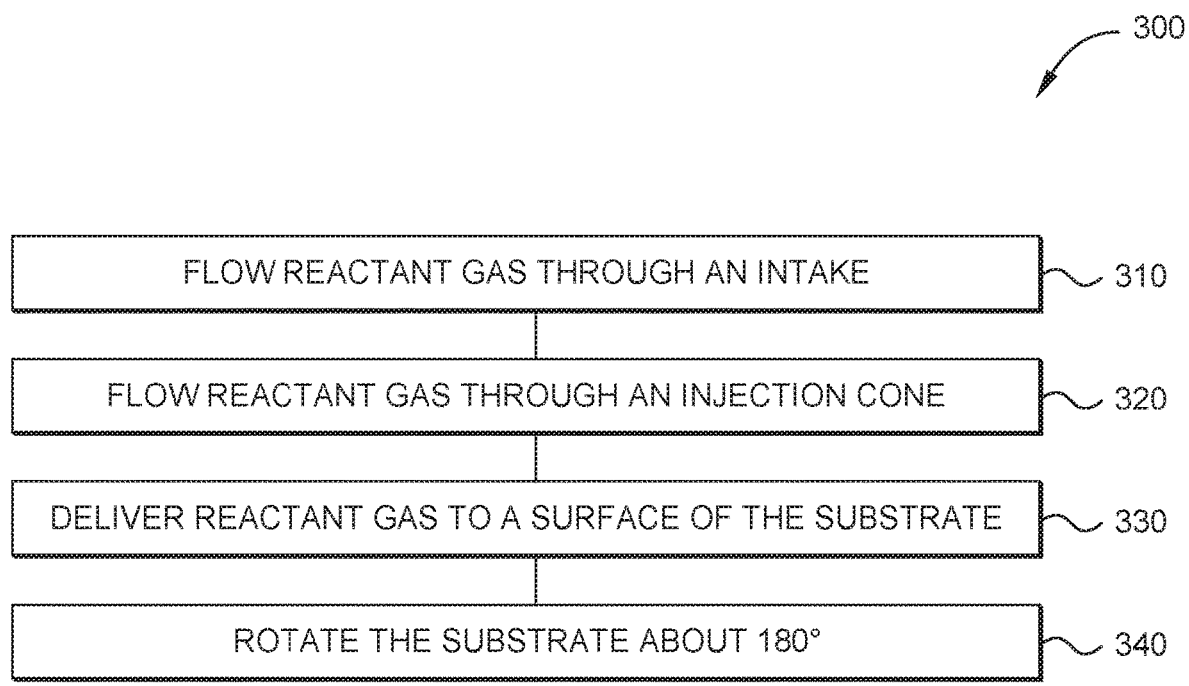
FIG. 3 is a flow diagram of method operations for delivering a reaction gas, according to one embodiment.

FIG. 3 is a flow diagram of method 300 operations for delivering a reaction gas, according to one embodiment. Although the method 300 operations are described in conjunction with FIGS. 1A-1D and 3, persons skilled in the art will understand that any system configured to perform the method operations, in any order, falls within the scope of the embodiments described herein. FIGS. 1A-1B illustrate the processing system 100 before the method 300 begins.

The method 300 begins at operation 310, where reactant gas is flowed through the intake 160. The reactant gas can be any of the reactant gases described above.

At operation 320, the reactant gas is flowed through the injection cone 200. The injection cone 200 can be any of the embodiments described above. The flow 150 of the reactant gas is delivered only through the top portion 232 of the injection cone 200, according to one embodiment. The flow 150 of the reactant gas is a laminar flow, according to one embodiment. The flow 150 of the reactant gas through the injection cone 200 has a Re of about 100 or less, according to one embodiment.

At operation 330, the reactant gas is delivered to a surface of the substrate 110. The reactant gas reacts with the surface of the substrate 110 as described above. The substrate 110 can be heated from a temperature of about 23° C. to about 1200° C. The reactant gas can be delivered such that the reactant gas grows the film 110f on the portion of the substrate 110 that is disposed over the higher growth portion 116 of the substrate support 105. About 60% to about 90% or more of the volume of the film 110f formation is disposed in the higher growth portion 116, according to one embodiment. In some embodiments, the substrate 110 is rotated continuously while the operations 310, 320, 330 are performed. FIG. 1C illustrates the processing system 100 after the film 110f has been deposited on the portion of the substrate 110 disposed over the higher growth portion 116 of the substrate support 105.

At optional operation 340, the substrate 110 is rotated about 180°, such that the film 110f is disposed over the portion of the substrate 110 disposed over the new lower growth portion 115' of the substrate support, and the portion of the substrate without the film growth is disposed over the higher growth portion 116 of the substrate support. Operations 310, 320, and 330 are repeated, such that a film 110' is grown on the substrate 110 disposed over the new higher growth portion 116' of the substrate support 105, which results in an even film growth of the film 110f, 110f' over the entire substrate 110. In other embodiments, the second delivery of the reaction gas can include a different gas, and thus the films 110f, 110f' can include different materials. FIG. 1D illustrates the processing system 100 after the film 110f, 110f' has been deposited on the substrate 110.

As described above, a processing system is provided. The processing system includes a substrate support system, an injection cone, and an intake. The injection cone includes one or more linear rudders. The linear rudders are disposed such that the flow of reactant gas through the injection cone results in film growth a specific portion of a substrate. The method includes flowing the gas through the injection cone and delivering the gas onto the substrate below.

The localization of the reactant gas, and thus the film growth, allows for film growth on a specific portion of the substrate. The substrate can be rotated, and/or the process repeated, resulting in piecewise or continuous growth of a film layer with improved uniformity.

While the foregoing is directed to embodiments of the present disclosure, other and further embodiments of the disclosure may be devised without departing from the basic scope thereof, and the scope thereof is determined by the claims that follow.

The invention claimed is:

1. An injection cone, comprising:
a body, comprising:
a first portion configured to deliver a reactant gas, the first portion comprising:
a bottom surface; and
a linear rudder, the linear rudder making an angle with an axis parallel to the bottom surface, the angle being from about 10° to about 40°; and
a second portion configured to accept the reactant gas, the first portion and the second portion separated by a dividing line.

2. The injection cone of claim 1, wherein the angle that each linear rudder makes with the bottom surface is from about 20° to about 30°.

3. An injection cone, comprising:
a body, comprising:
a first portion configured to deliver a reactant gas, the first portion comprising:
a bottom surface; and
a linear rudder, the linear rudder having a length of about 25 mm to about 75 mm; and
a second portion configured to accept the reactant gas, the first portion and the second portion separated by a dividing line.

4. The injection cone of claim 3, wherein the injection cone is separated into the top portion and the bottom portion by an injection separation line, wherein the linear rudder is disposed in the top portion of the injection cone.

5. An injection cone, comprising:
a body, comprising:
a first portion configured to deliver a reactant gas, the first portion comprising:
a bottom surface; and
a linear rudder, the linear rudder having disposed about 12 mm to about 40 mm from the bottom surface; and
a second portion configured to accept the reactant gas, the first portion and the second portion separated by a dividing line.

6. A processing system, comprising:
a substrate support system comprising a substrate support;
an injection cone, the injection cone separated into a top portion and a bottom portion by an injection separation line, the injection cone configured to deliver reaction gas through only the top portion, the injection cone comprising:
a body, comprising:
a first portion configured to deliver a reactant gas toward a higher growth portion of the substrate support, the first portion comprising:
a bottom surface; and
a linear rudder; and
a second portion configured to accept the reactant gas; and
an intake coupled to the injection cone, the intake configured to deliver the reactant gas to the injection cone.

7. The processing system of claim 6, wherein the substrate support is divided into the higher growth portion and a lower growth portion by a support separation line, and the support separation line is parallel to the injection separation line.

8. The processing system of claim 7, wherein the support separation line separates the higher growth portion and the lower growth portion such that the higher growth portion and the lower growth portion each have about an equal area.

9. A processing system, comprising:
a substrate support system comprising a substrate support;
an injection cone, the injection cone is disposed such that it makes an angle with an edge of the substrate support, wherein the angle is from about 20° to about 30°, the injection cone, comprising:
a body, comprising:
a first portion configured to deliver a reactant gas toward a higher growth portion of the substrate support, the first portion comprising:
a bottom surface; and
a linear rudder; and
a second portion configured to accept the reactant gas; and
an intake coupled to the injection cone, the intake configured to deliver the reactant gas to the injection cone.

10. A method of delivering a reactant gas, the method comprising:
flowing the reactant gas through an intake;
flowing the reactant gas through an injection cone, the injection cone comprising:
a body, comprising:
a first portion configured to deliver the reactant gas, the first portion comprising:
a bottom surface; and
a linear rudder, the linear rudder making an angle with an axis parallel to the bottom surface, the angle being from about 10° to about 40°; and
a second portion configured to accept the reactant gas; and
delivering the reactant gas to a surface of a substrate disposed over a substrate support such that a film is formed on the surface of the substrate.

11. The method of claim 10, wherein the injection cone is separated into a top portion and a bottom portion by a dividing line, the injection cone configured to deliver reaction gas through only the top portion of the injection cone.

12. The method of claim 11, wherein the substrate is divided into a higher growth portion and a lower growth portion by a separation line, and greater than about 60% of the film formation occurs on the higher growth portion of the substrate.

13. The method of claim 12, wherein the separation line is parallel to the dividing line.

14. The method of claim 11, wherein a flow of the reactant gas through the injection cone comprises is a laminar flow.

15. The method of claim 14, wherein the flow of the reactant gas through the injection cone has a Reynolds number (Re) of about 100 or less.

16. The method of claim 10, wherein the substrate is rotated continuously during the method.

17. The method of claim 10, further comprising, after the delivering the reactant gas, rotating the substrate about 180°, and repeating the flowing the reactant gas through an intake, flowing the reactant gas through an injection cone, and delivering the reactant gas.

* * * * *